(12) United States Patent
Yang et al.

(10) Patent No.: US 11,171,310 B2
(45) Date of Patent: Nov. 9, 2021

(54) PACKAGE STRUCTURE HAVING MULTIPLE ORGANIC LAYERS WITH EVENLY DISTRIBUTED LIQUID CRYSTAL MOLECULES. DISPLAY PANEL, AND DISPLAY DEVICE

(71) Applicant: Wuhan China Star Optoelectronics Semiconductor Display Technology Co., Ltd., Wuhan (CN)

(72) Inventors: Jie Yang, Wuhan (CN); Ming Zhang, Wuhan (CN); Cunjun Xia, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 36 days.

(21) Appl. No.: 16/625,734

(22) PCT Filed: Nov. 25, 2019

(86) PCT No.: PCT/CN2019/120755
§ 371 (c)(1),
(2) Date: Dec. 22, 2019

(87) PCT Pub. No.: WO2021/031434
PCT Pub. Date: Feb. 25, 2021

(65) Prior Publication Data
US 2021/0234123 A1    Jul. 29, 2021

(30) Foreign Application Priority Data

Aug. 21, 2019    (CN) .......................... 201910772801.2

(51) Int. Cl.
*H01L 51/52* (2006.01)
*H01L 27/32* (2006.01)

(52) U.S. Cl.
CPC ...... *H01L 51/5253* (2013.01); *H01L 27/3232* (2013.01); *H01L 27/3244* (2013.01); *H01L 51/5268* (2013.01)

(58) Field of Classification Search
CPC combination set(s) only.
See application file for complete search history.

(56) References Cited

U.S. PATENT DOCUMENTS

2006/0246229 A1* 11/2006 Suemasu ............ C09K 19/2007
                                                        428/1.1
2012/0217863 A1    8/2012 Hamatani et al.
2015/0378240 A1   12/2015 Wang et al.
(Continued)

FOREIGN PATENT DOCUMENTS

| CN | 104090445 | 10/2014 |
|---|---|---|
| CN | 109656049 | 4/2019 |
| CN | 110021637 | 7/2019 |

*Primary Examiner* — Nduka E Ojeh

(57) ABSTRACT

A package unit, display panel, and display device are provided. The package unit includes a first organic layer and a package unit disposed over the first organic layer. The first organic layer is disposed over and adjacent to a side of the package structure illuminated by light, and the first organic layer is evenly distributed with liquid crystal molecules of an oriented arrangement to converge light passing through the first organic layer and emit light within a fixed angle range.

14 Claims, 3 Drawing Sheets

(56) References Cited

U.S. PATENT DOCUMENTS

| | | | | |
|---|---|---|---|---|
| 2016/0187552 A1* | 6/2016 | Yoo | ............... | G02B 5/3016 |
| | | | | 359/489.07 |
| 2017/0317287 A1* | 11/2017 | Hirakata | ............ | H01L 51/50 |
| 2018/0239214 A1* | 8/2018 | Ji | ............... | G02F 1/133526 |
| 2019/0189701 A1* | 6/2019 | Bang | ............ | H01L 51/5271 |

* cited by examiner

PACKAGE STRUCTURE HAVING MULTIPLE ORGANIC LAYERS WITH EVENLY DISTRIBUTED LIQUID CRYSTAL MOLECULES. DISPLAY PANEL, AND DISPLAY DEVICE

RELATED APPLICATIONS

This application is a National Phase of PCT Patent Application No. PCT/CN2019/120755 having International filing date of Nov. 25, 2019, which claims the benefit of priority of Chinese Patent Application No. 201910772801.2 filed on Aug. 21, 2019. The contents of the above applications are all incorporated by reference as if fully set forth herein in their entirety.

FIELD AND BACKGROUND OF THE INVENTION

The present invention relates to a display panel technology, and more particularly to a package structure, display panel, and display device.

Organic light emitting diode (OLED) display panels have become focus of current research and development (R&D) and production due to their wide color gamut, wide viewing angles, high contrast, and flexibility. Present thin film packaging structures are mainly achieved by alternately stacking inorganic/organic film layers. The inorganic film layers mainly serve as a barrier protection for water and oxygen barrier, and the organic film layers mainly function as stress release and particle coverage.

Technical Problem Summary of the Invention

At present, a light emitting layer in the OLED display panel is mainly formed by vapor deposition of small molecular organic materials, and the refractive index (RI) of the material is mostly between 1.4-1.7, and the refractive index of the inorganic film layer of the thin film encapsulation (TFE) package structure is substantially greater than 1.8. Due to the difference of refractive index between the organic/inorganic films, large-angle incident light is easy to generate total reflection and small-angle incident light cannot be emitted due to multiple refraction and reflection, thereby greatly affecting the light output efficiency of OLED display panel. In addition, in the existing package structure in which the organic/inorganic film layers are stacked in the alternating way, the inorganic film layer having a large refractive index with respect to OLED is directly in contact with the light emitting layer, and the contact surface of the inorganic film layer and the light emitting layer generates a refractive interface, thereby further reducing the light output efficiency of the OLED display panel.

The embodiment of the present application provides a package structure, a display panel, and a display device to solve the problems of the existing package structure affecting the light output efficiency of OLED.

To solve the above problems, the technical solution provided by the present application is as follows:

An embodiment of the present application provides a package unit, comprising a first organic layer and a package unit disposed over the first organic layer;

wherein the first organic layer is disposed on and adjacent to a side of the package structure illuminated by light, and the first organic layer is evenly distributed with liquid crystal molecules of an oriented arrangement to converge light passing through the first organic layer and emit light within a fixed angle range.

In the package unit of the embodiment of the present application, the package unit comprises a second organic layer and an inorganic layer disposed in an alternating manner, and the number of the second organic layer and the inorganic layer is equal to or greater than one.

In the package unit of the embodiment of the present application, at least one of the second organic layers is evenly distributed with liquid crystal molecules of the oriented arrangement.

In the package unit of the embodiment of the present application, the second organic layer of the package unit is at a side away from the first organic layer.

In the package unit of the embodiment of the present application, the inorganic layer of the package unit is adjacent to the first organic layer.

In the package unit of the embodiment of the present application, the number of the second organic layer and the inorganic layer is two.

In the package unit of the embodiment of the present application, a material of the second organic layer is acrylic acid or hexamethyldisiloxane.

In the package unit of the embodiment of the present application, a material of the inorganic layer is silicon nitride, silicon oxide or aluminum oxide.

In the package unit of the embodiment of the present application, the fixed angle range and a vertical line of the first organic layer have an inclined angle from 0 to 10 degrees.

In the package unit of the embodiment of the present application, a volume ratio of the liquid crystal molecules to the first organic layer is less than 50%.

In the package unit of the embodiment of the present application, further comprises a light scattering layer disposed over the package unit, wherein the first organic layer and the light scattering layer are respectively disposed on both sides of the package unit.

In the package unit of the embodiment of the present application, the light scattering layer comprises a plurality of convex transparent films arranged in an array, and the convex transparent film is disposed on a side of the light scattering layer away from the package unit.

In the package unit of the embodiment of the present invention, the convex transparent films have a width of 100 μm to 400 μm.

According to the aspect of the present application, a display panel is further provided, comprising:

a substrate;

a thin film transistor layer disposed over the substrate;

a light emitting layer disposed over the thin film transistor layer; and the package structure as describe above, wherein the package structure is disposed over the light emitting layer.

In the display panel of the embodiment of the present invention, a side of the package structure illuminated by light is adjacent to the light emitting layer.

According to an aspect of the present application, a display device is further provided, comprising the display panel disclosed above.

The advantageous effects of the present application are as follows: refraction between the package structure and the light-emitting layer is less affected or there is no refraction interface therebetween through disposing a first organic layer over a side of the package structure illuminated by light while refractive index of the first organic layer and the material of the light-emitting layer in the OLED display panel is similar or the same. Meanwhile, the light output efficiency of the OLED display panel is improved through the liquid crystal molecules of an oriented arrangement in the first organic layer in which makes light illuminated by the light-emitting layer passes through the first organic layer to converge and emit light within a fixed angle range. In addition, a wide viewing angle can be achieved by combining the structure of the light scattering layer and the color shift can be simultaneously reduced.

BRIEF DESCRIPTION OF THE SEVERAL VIEWS OF THE DRAWINGS

To detail explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DETAILED DESCRIPTION OF SPECIFIC EMBODIMENTS OF THE INVENTION

Figure 1:
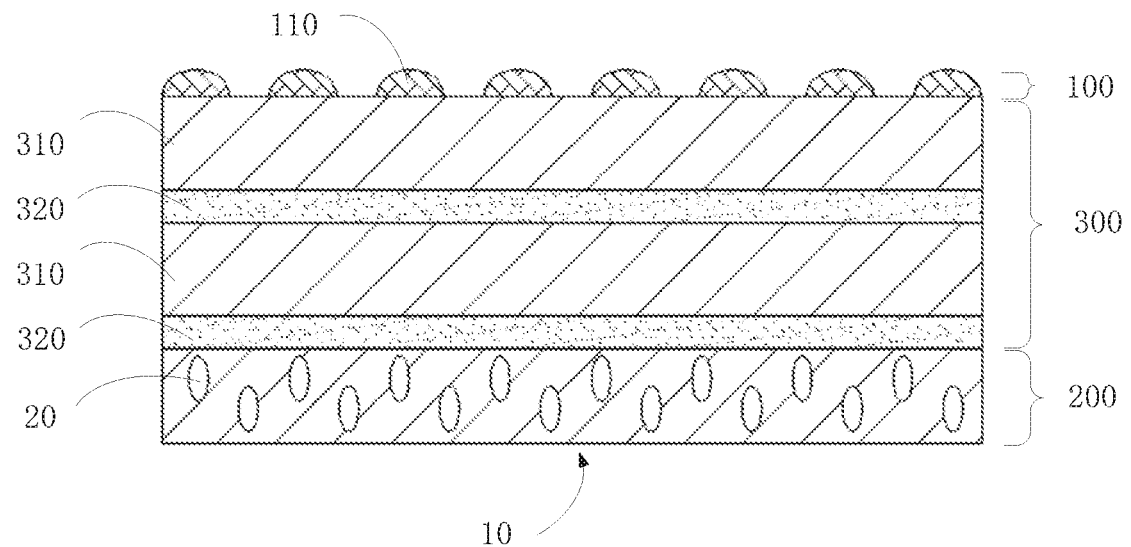
FIG. 1 is a schematic structural diagram of a package structure according to an embodiment of the present application.

Please refer to the drawings in the drawings, in which the same reference numerals represent the same components. The following description is based on the specific embodiments of the present invention as illustrated and should not be construed as limiting the specific embodiments that are not described herein.

In the description of the present application, it is to be understood that the terms "center", "longitudinal", "transverse", "length", "width", "thickness", "upper", "lower", "front", "back", "left", "right", "vertical", "horizontal", "top", "bottom", "inside", "outside", etc. indicating orientation or positional relationship are based on the orientation or positional relationship shown in the drawings, and are merely for the convenience of the description of the present application and the simplification of the description. The above terms are not intended to indicate or imply that the device or component referred to has a specific orientation and constructed and operated in a specific orientation, and thus, are not to be construed as limiting the present application. Moreover, the terms "first" and "second" are used for descriptive purposes only and are not to be construed as indicating or implying a relative importance or implicitly indicating the number of technical features indicated. Thus, features defining "first" or "second" may include one or more of the described features either explicitly or implicitly. In the description of the present application, the meaning of "a plurality" is two or more unless specifically defined otherwise.

In the description of the present application, it should be noted that the terms "installation", "connected", and "connected" are to be understood broadly, and may be fixed or detachable, for example, unless otherwise specifically defined and defined. Connected, or integrally connected; can be mechanical or electrical; can be directly connected, or indirectly connected through an intermediate medium, can be the internal communication of the two components. The specific meanings of the above terms in the present application can be understood in the specific circumstances for those skilled in the art.

The terminology used herein is for the purpose of describing the particular embodiments, The singular forms "a", "an", It is also to be understood that the terms "comprising" and/or "including" includes the use of the stated features, integers, steps, operations, units and/or components," and one or more other features, integers, steps, operations, units, components, and/or combinations thereof are not excluded.

The present application will be further described below in conjunction with the accompanying drawings and embodiments.

As shown in FIG. 1, an embodiment of the present application provides a package structure 1 comprising a first organic layer 200 and a package unit 300 disposed over the first organic layer 200.

The first organic layer 200 is disposed over and adjacent to a side 10 of the package structure 1 illuminated by the light. The first organic layer 200 is evenly distributed with liquid crystal molecules 20 of an oriented arrangement to converge light passing through the first organic layer and emit light within a fixed angle range.

It is to be understood that, in a specific use, the package structure 1 of the present application is applied to an organic light emitting diode (OLED) display panel, and the OLED display panel comprises a substrate, a thin film transistor layer, a light emitting layer, and a package structure 1 in the present application that are sequentially disposed. The package structure 1 is disposed over the light-emitting layer for encapsulating the light-emitting layer. It is noted that the first organic layer 200 is disposed over and adjacent to the side 10 of the package structure 1 illuminated by light, and the side 10 is the side of the package structure 1 adjacent to the light-emitting layer. The light emits to the package structure 1 is the light scattered by the light-emitting layer.

According to the package structure 1 in which the inorganic film layer is directly in contact with the light-emitting layer, a refractive interface is formed between the light-emitting layer and the inorganic film layer, so that the light-emitting layer is refracted at the initial light-emitting stage to reduce the light-emitting efficiency. In the present application, the first organic layer 200 is in contact with the light emitting layer, and the organic material in the first organic layer 200 and the organic material in the light emitting layer have a smaller refractive index difference. More specifically, the organic material in the first organic layer 200 is selectively adjusted according to refractive index of the actual light emitting layer, such that the first organic layer 200 and the light-emitting layer may have the same refractive index, so that the light illuminated by the light-emitting layer directly enters the first organic layer 200. In addition, in combination with the liquid crystal molecules 20 of the oriented arrangement that are evenly distributed in the first organic layer 200, the light illuminated by the light emitting layer is converged within a fixed angle range from a side of the first organic layer 200 away from the light emitting layer to improve the light-emitting efficiency of the light-emitting layer.

Figure 3:
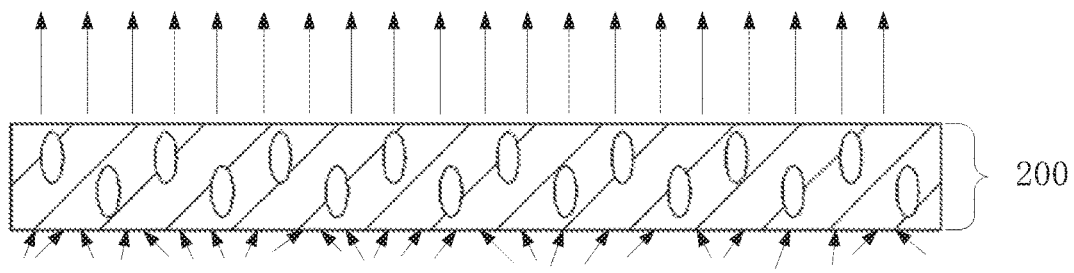
FIG. 3 is a schematic diagram of a first organic layer guiding and converging light in a package structure according to an embodiment of the present disclosure.

It can be understood that during converging the light illuminated by the light emitting layer within a fixed angle range from the side of the first organic layer 200 away from the light emitting layer, the angle range can be decided and controlled according to adjustments of the uniformly distributed liquid crystal molecules 20. Specifically, the long axis direction of the liquid crystal molecules 20 is perpendicular to the first organic layer 200, and a volume ratio of the liquid crystal molecules 20 to the organic layer 200 is less than 50%, and the liquid crystal molecules 20 are E7 liquid crystals. As shown in FIG. 3, the light below the first organic layer 200 is light scattered by the light emitting layer, and the light above the first organic layer 200 is emitted light passing through and being converged by the liquid crystal molecules 20 in a fixed angle range, and an inclined angle between the fixed angle range and a vertical line of the first organic layer 200 is from 0 to 10 degrees.

In an embodiment, the package unit 300 comprises a second organic layer 310 and an inorganic layer 320 disposed in an alternating manner, and the number of the second organic layer 310 and the inorganic layer 320 is equal to or greater than one. Specifically, the materials of the second organic layer 310 and the inorganic layer 320 are encapsulating materials of better light-transmissive properties, and the material of the second organic layer 310 can be acrylic acid (Acrylic), hexamethyldisiloxane (HMDSO), or the like. The material of the inorganic layer 320 may be silicon nitride (SiNx), silicon oxide (SiOx), aluminum oxide ($Al_2O_3$), etc., such that light converged by the first organic layer 200 can pass through the package unit 300 with less loss. It can be understood that, the organic material in the first organic layer 200 is also an organic encapsulating material having better light transmittance.

Figure 2:
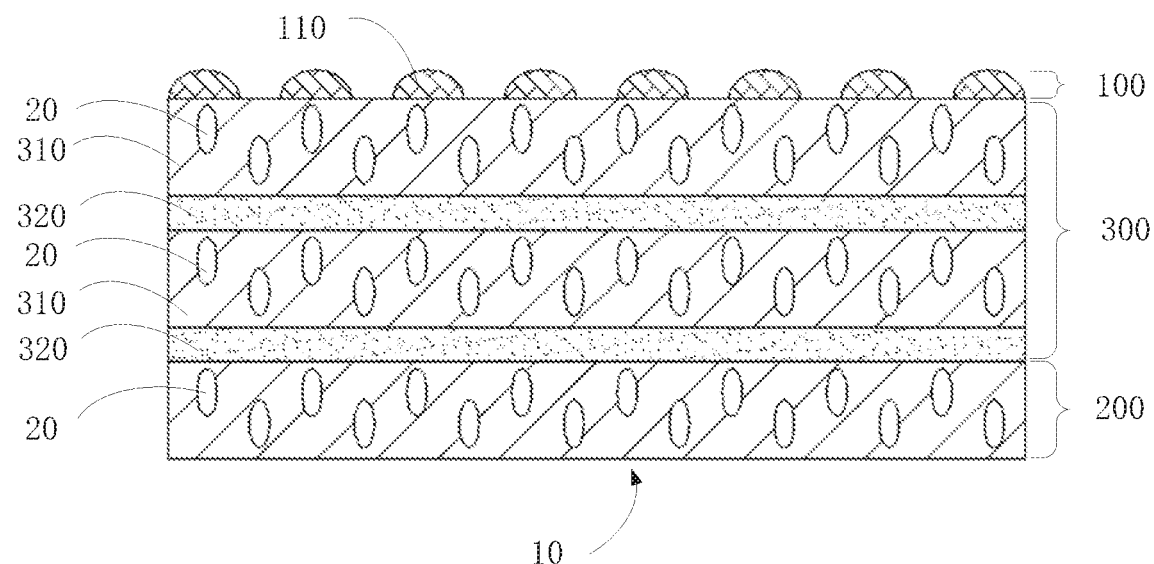
FIG. 2 is a schematic structural diagram of another package structure according to an embodiment of the present disclosure.

It is to be understood that, in the present application, the number of layers of the second organic layer 310 and the inorganic layer 320 which are alternately stacked in the package unit 300 is not limited. As shown in FIG. 1 to FIG. 2, the number of the second organic layer 310 and the inorganic layer 320 is two.

It is to be noted that, according to the above structure, the liquid crystal molecules 20 of an oriented arrangement may be evenly distributed in at least one of the second organic layers 310 in the present application, so that the light converged by the first organic layer 200 in the encapsulating unit 300 is again guided by the liquid crystal molecules 20 to ensure the light-emitting efficiency. Specifically, as shown in FIG. 2, for example, the liquid crystal molecules 20 are respectively disposed in each of the second organic layers 310, and the specific structural functions are the same as that of the first organic layer 200 described above, and details are not described herein again.

It can be understood that, in the present application, the stacking order of the second organic layer 310 and the inorganic layer 320 which are provided in an alternating manner is not limited. In an embodiment, as shown in FIG. 1 to FIG. 2, the side in the package unit 300 away from the first organic layer 200 is the second organic layer 310, and the side closer to the first organic layer 200 is the inorganic layer 320.

In an embodiment, a light scattering layer 100 is further disposed over the package unit 300. The first organic layer 200 and the light scattering layer 100 are respectively disposed over two sides of the package unit 300, and the light scattering layer 100 is configured to scatter light that is converged light of high emitting rate passing through the first organic layer 200 and the package unit 300, thereby reducing the color shift and also satisfying the display function of wide viewing angle. Specifically, as shown in FIG. 1 to FIG. 2, the light scattering layer 100 comprises a plurality of convex transparent films 110 arranged in an array, and the convex transparent film 110 is disposed over a side of the light scattering layer 100 away from the package unit 300. The side of the convex film 110 away from the side of the package unit 300 has a curved surface, and the width of the convex transparent film 110 is 100 μm to 400 μm. It can be understood that, in order to achieve the display purposes of reducing the color shift and satisfying the wide viewing angle, the present application provides convex lens scattering by the convex transparent film 110. It can be understood that the structure of the light scattering layer of the present application is not limited thereto.

In summary, refraction between the package structure and the light-emitting layer is less affected or there is no refraction interface therebetween in the present application through disposing a first organic layer over a side of the package structure 1 illuminated by light in which refractive index of the first organic layer and the material of the light-emitting layer material in the OLED display panel is similar or the same. At the same time, the light output efficiency of the OLED display panel is improved through the liquid crystal molecules of the oriented arrangement that are evenly distributed in the first organic layer in which makes light illuminated by the light-emitting layer passes through the first organic layer to converge and emit light within a fixed angle range. In addition, a wide viewing angle can be achieved by combining the structure of the light scattering layer and the color shift can be simultaneously reduced.

Figure 6:
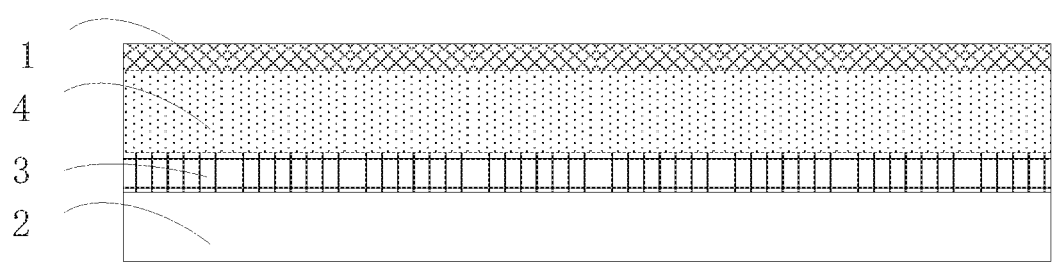
FIG. 6 is a schematic structural diagram of a display panel according to an embodiment of the present application.

The application also provides a display panel, as shown in FIG. 6, comprising:

a substrate 2, a thin film transistor layer 3 disposed over the substrate 2;

a light emitting layer 4 disposed over the thin film transistor layer 3;

the package structure 1 as described above disposed over the light-emitting layer 4.

The present application further provides a display device comprising the display panel as described above.

In summary, the display panel and the display device of the present application both comprise the package structure 1 as described above, wherein the light-emitting layer is adjacent to a side of the first organic layer in the package structure 1 to make the light illuminated by the light-emitting layer passing through the first organic layer and being converged to emit in a fixed angle range, thereby improving the light output efficiency of the display panel or the display device. In addition, a structure of the light scattering layer is combined to disperse the light to satisfy a wide viewing angle, and color shift is also reduced.

Figure 4:
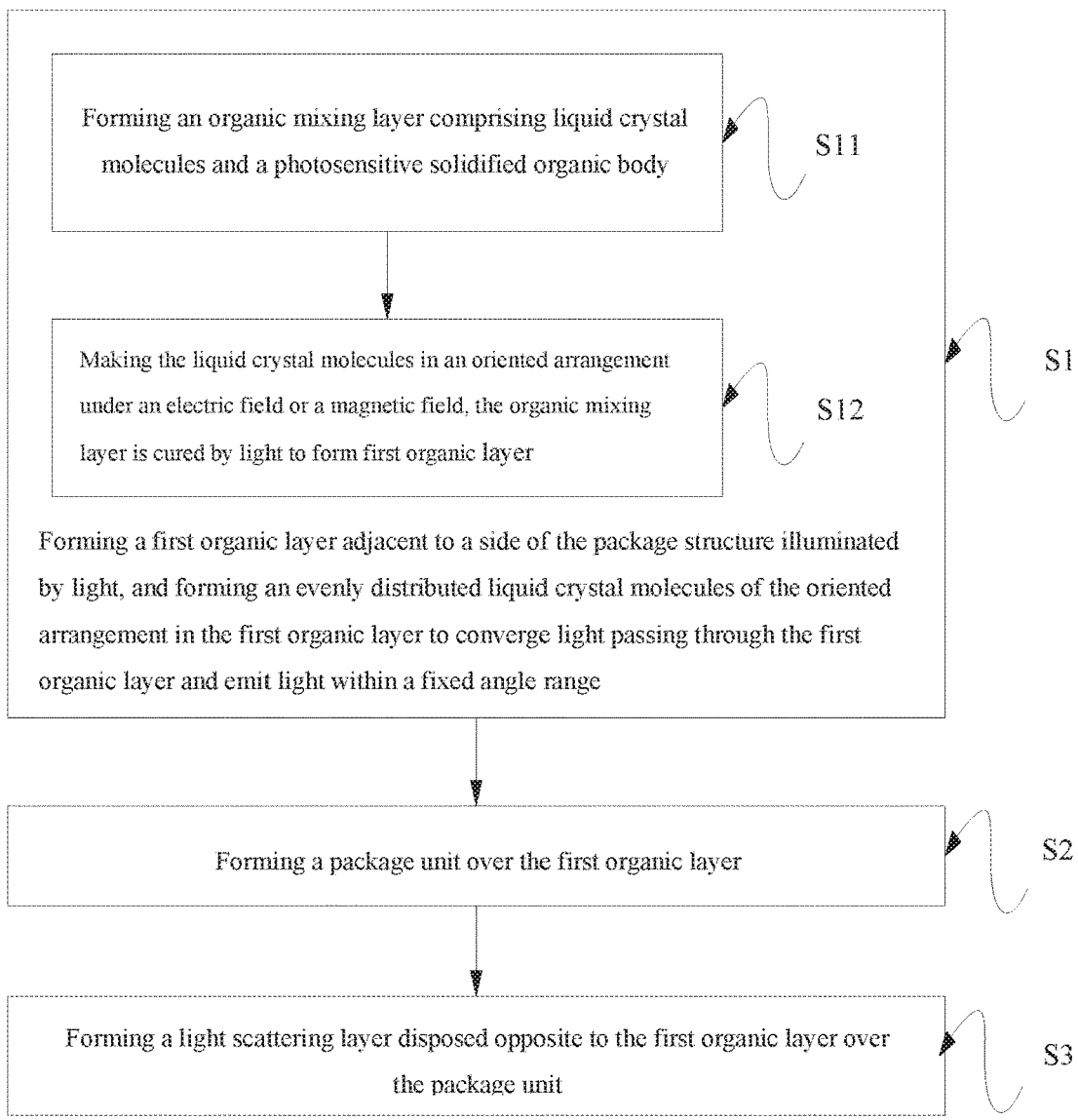
FIG. 4 is a schematic block diagram showing a flowchart of a method for fabricating a package structure according to an embodiment of the present application.

The application also provides a manufacturing method of the package structure 1, as shown in FIG. 4, comprising:

Step S1, forming a first organic layer 200 adjacent to a side of the package structure 1 illuminated by light, and forming an evenly distributed liquid crystal molecules 20 of an oriented arrangement in the first organic layer 200 to converge light passing through the first organic layer and emit light within a fixed angle range;

Step S2, forming a package unit 300 over the first organic layer 200;

Step S3, forming a light scattering layer 100 disposed opposite to the first organic layer 200 over the package unit 300.

Figure 5:
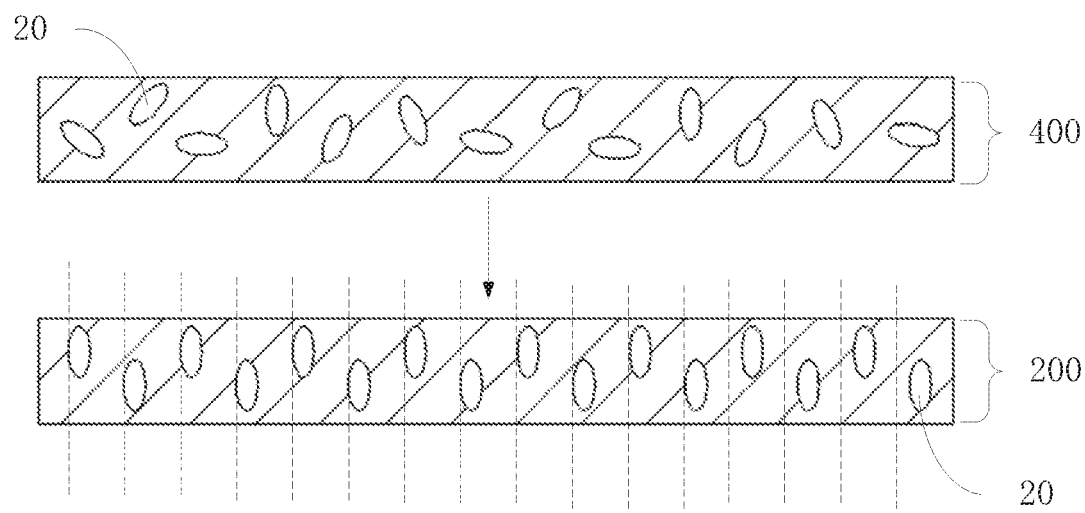
FIG. 5 is a schematic diagram of a process of forming a first organic layer in a method for fabricating a package structure according to an embodiment of the present application.

In an embodiment, as shown in FIG. 5, in step S1, forming a first organic layer 200 adjacent to a side of the package structure 1 illuminated by light, and forming an evenly distributed liquid crystal molecules 20 of the oriented arrangement in the first organic layer 200 to converge light passing through the first organic layer and emit light within a fixed angle range, comprising:

Step S11, forming an organic mixing layer 400 comprising liquid crystal molecules 20 and a photosensitive solidified organic body;

In step S12, making the liquid crystal molecules 20 in an oriented arrangement under the action of an electric field or a magnetic field, and the organic mixing layer 400 is cured by light to form the first organic layer 200.

In one embodiment, as schematically shown in FIG. 5, the organic mixed layer 400 containing the scattered liquid crystal molecules 20 and the photosensitive solidified organic body is subjected to an electric field or a magnetic field (shown by a broken line in the figure) to cause the liquid crystal molecules 20 to be oriented with an oriented arrangement, and curing the organic mixed layer 400 in combination with ultraviolet light to form the first organic layer 200. It can be understood that, when the second organic layer 310 also contains the liquid crystal molecules 20, the fabricating method thereof is similar with the fabricating method of the first organic layer 200 and will not be described herein. When the second organic layer 310 does not contain the liquid crystal molecules 20, it can be formed by inkjet printing, vapor deposition or coating.

The light scattering layer 100 disposed opposite to the first organic layer 200 is formed over the package unit 300. Specifically, the light scattering layer 100 comprises a plurality of convex transparent films 110 arranged in an array. The material of the astigmatism layer 100 is a high light transmittance organic material such as acrylic acid (Acrylic) or hexamethyldisiloxane (HMDSO). It may be printed on the surface of the packaging unit 300 by inkjet printing and then cured to form the convex transparent film 110.

In summary, the manufacturing method of the package structure 1 of the present application is simple and suitable for mass production. At the same time, the package structure 1 made by the method effectively limits the direction of light emission, and the light emitting intensity of the OLED display panel can be significantly improved.

In the present application, refraction between the package structure and the light-emitting layer is less affected or there is no refraction interface therebetween in the present application through disposing a first organic layer over a side of the package structure illuminated by light while refractive index of the first organic layer and the material of the light-emitting layer in the OLED display panel is similar or the same. At the same time, the light output efficiency of the OLED display panel is improved through the liquid crystal molecules of an oriented arrangement that are evenly distributed in the first organic layer in which makes light illuminated by the light-emitting layer passes through the first organic layer to converge and emit light within a fixed angle range. In addition, a wide viewing angle can be achieved by combining the structure of the light scattering layer and the color shift can be simultaneously reduced.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A package structure, comprising:
   a first organic layer and a package unit disposed over the first organic layer; and
   a second organic layer and an inorganic layer disposed in an alternating manner, wherein the inorganic layer is adjacent to the first organic layer, and number of the second organic layer and the inorganic layer is equal to or greater than one;
   wherein the first organic layer is disposed over and adjacent to a side of the package structure illuminated by light, and the first organic layer is evenly distributed with liquid crystal molecules of an oriented arrangement to converge light passing through the first organic layer and emit light within a fixed angle range.

2. The package structure of claim 1, wherein at least one of the second organic layers is evenly distributed with the liquid crystal molecules of the oriented arrangement.

3. The package structure of claim 1, wherein the second organic layer of the package unit is at a side away from the first organic layer.

4. The package structure of claim 1, wherein the number of the second organic layer and the inorganic layer is two.

5. The package structure of claim 1, wherein a material of the second organic layer is acrylic acid or hexamethyldisiloxane.

6. The package structure of claim 1, wherein a material of the inorganic layer is silicon nitride, silicon oxide, or aluminum oxide.

7. The package structure of claim 1, wherein the fixed angle range and a vertical line of the first organic layer have an inclined angle from 0 to 10 degrees.

8. The package structure of claim 1, wherein a volume ratio of the liquid crystal molecules to the first organic layer is less than 50%.

9. The package structure of claim 1, further comprising:
   a light scattering layer disposed over the package unit, wherein the first organic layer and the light scattering layer are respectively disposed on both sides of the package unit.

10. The package structure of claim 9, wherein the light scattering layer comprises a plurality of convex transparent films arranged in an array, and the convex transparent film is disposed over a side of the light scattering layer away from the package unit.

11. The package structure of claim 9, wherein the convex transparent films have a width of 100 μm to 400 μm.

12. A display panel, comprising:
   a substrate,
   a thin film transistor layer disposed over the substrate;
   a light emitting layer disposed over the thin film transistor layer; and
   the package structure of claim 1, wherein the package structure is disposed over the light emitting layer.

13. The display panel of claim 12, wherein a side of the package structure illuminated by light is adjacent to the light emitting layer.

14. A display device, comprising the display panel of claim 12.

* * * * *